US007419891B1

(12) United States Patent
Chen et al.

(10) Patent No.: US 7,419,891 B1
(45) Date of Patent: Sep. 2, 2008

(54) METHOD AND SYSTEM FOR PROVIDING A SMALLER CRITICAL DIMENSION MAGNETIC ELEMENT UTILIZING A SINGLE LAYER MASK

(75) Inventors: Benjamin Chen, San Jose, CA (US); Hongping Yuan, Fremont, CA (US); Danning Yang, Fremont, CA (US); Wei Zhang, Fremont, CA (US); Hugh C. Hiner, Fremont, CA (US); Lei Wang, Fremont, CA (US); Yingjian Chen, Fremont, CA (US); Brant Nease, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 18 days.

(21) Appl. No.: 11/352,652

(22) Filed: Feb. 13, 2006

(51) Int. Cl.
*H01L 21/20* (2006.01)
(52) U.S. Cl. .................................. 438/496; 257/E21.092
(58) Field of Classification Search .................. 438/496
See application file for complete search history.

(56) References Cited

U.S. PATENT DOCUMENTS

| 5,471,555 | A | 11/1995 | Braga et al. |
| 6,669,983 | B2 | 12/2003 | Kagami et al. |
| 6,683,759 | B1 | 1/2004 | Chang et al. |
| 6,687,098 | B1 | 2/2004 | Huai |
| 6,760,200 | B2 | 7/2004 | Hasegawa |
| 6,876,527 | B2 | 4/2005 | Gill |
| 2001/0000445 | A1 | 4/2001 | Shiroishi |
| 2004/0021024 | A1 | 2/2004 | Yoshimura et al. |
| 2004/0264240 | A1* | 12/2004 | Hineman et al. ............. 365/158 |
| 2005/0191764 | A1* | 9/2005 | Yates et al. ..................... 438/3 |

* cited by examiner

*Primary Examiner*—Lex Malsawma
*Assistant Examiner*—Elias Ullah
(74) *Attorney, Agent, or Firm*—Jonathan E. Prejean, Esq.; Strategic Patent Group

(57) ABSTRACT

The method and system for providing a magnetic element are disclosed. The method and system include providing a magnetic element stack that includes a plurality of layers and depositing a stop layer on the magnetic element stack. The method and system also include providing a dielectric anti-reflective coating (DARC) layer on the stop layer, forming a single layer mask for defining the magnetic element on a portion of the DARC layer, and removing a remaining portion of the DARC layer not covered by the single layer mask. The portion of the DARC layer covers a portion of the stop layer. The method further includes removing a remaining portion of the stop layer and defining the magnetic element using at least the portion of stop layer as a mask.

16 Claims, 8 Drawing Sheets

METHOD AND SYSTEM FOR PROVIDING A SMALLER CRITICAL DIMENSION MAGNETIC ELEMENT UTILIZING A SINGLE LAYER MASK

FIELD OF THE INVENTION

The present invention relates to magnetic recording technology, and more particularly to a method and system for providing a magnetic element capable of having a smaller critical dimension using a single layer mask.

BACKGROUND

FIG. 1 depicts a conventional method 10 for providing a conventional magnetic element, such as magnetoresistive elements used in read transducers. FIGS. 2-3 depict the conventional magnetic element during fabrication. Referring to FIGS. 1-3, the layers for the conventional magnetic element are deposited, via step 12. For a conventional tunneling magnetoresistance (TMR) stack that may be used in a read transducer, step 12 may include depositing a pinning layer such as an antiferromagnetic (AFM) layer, a pinned layer, a nonmagnetic spacer layer, and a free layer. The pinned and free layers are typically ferromagnetic or synthetic antiferromagnetic layers including two ferromagnetic layers separated by a nonmagnetic, conductive layer. For a conventional TMR stack, the nonmagnetic spacer layer is an insulator, such as $Al_2O_3$, crystalline MgO, and/or titanium oxide, that provides a tunneling barrier.

A conventional undercut bilayer structure is provided on the conventional magnetic element layers, via step 14. FIG. 2 depicts the conventional magnetic element layers 20 and the conventional undercut bilayer structure 30. The conventional magnetic element layers 20 include an AFM layer 22, a pinned layer 24, an insulating, nonmagnetic spacer layer 26, and a free layer 28. Other layers, such as seed or capping layers, might also be used. The conventional undercut bilayer structure 30 includes two layers 32 and 34. The lower layer is typically a PMGI layer 32, while the upper layer is typically a photoresist layer 34. The PMGI layer 32 is narrower than the photoresist layer 34 to provide the undercut 36.

The pattern provided by the conventional undercut bilayer structure 30 is transferred to the underlying magnetic element layers 20, via step 16. In step 16, therefore, the magnetic element is defined. FIG. 3 depicts the conventional magnetic element 20' that has been formed prior to removal of the conventional undercut bilayer structure 30. The conventional magnetic element 20' has been defined from the layers 22', 24', 26', and 28'.

Processing is completed for the conventional magnetic element 20' and the conventional device in which the conventional magnetic element 20' resides, via step 18. Step 18 includes lifting off the conventional undercut bilayer structure 30, which exposes the underlying conventional magnetic element 20'. Step 18 may also include providing subsequent layers and processing steps. For example, insulating layers, hard bias layers, fillers, and contacts to the conventional magnetic element 20' may be provided in step 18. Typically, these layers are provided prior to lift-off of the conventional undercut bi-layer structure 30 so that the conventional undercut bi-layer structure 30 can act as a mask for the conventional magnetic element 20'. Thus, the conventional magnetic element 20' in a conventional device, such as a read transducer and/or merged head, may be formed.

Although the conventional method 10 and the conventional magnetic element 20' can function, one of ordinary skill in the art will readily recognize that the trend in magnetic recording technology is toward higher densities and smaller sizes. Thus, the critical dimensions in write or read heads are currently below those in semiconductor processing. Further, as sizes shrink to provide areal densities above 120 Gb/in$^2$, the lift-off performed in step 18 becomes more difficult. For printed critical dimensions of the photoresist layer 34 below 0.1 micrometer, it is difficult to provide a small enough the PMGI layer 32 to generate a sufficient undercut for lift-off. For example, the undercut 36 must typically be greater than at least 0.03 micrometer for complete liftoff of the conventional undercut bilayer structure 30. This means that the PMGI layer 32 is only 0.04 micrometers in width for a 0.1 micrometer photoresist layer 34. For smaller geometries having critical dimensions of less than 0.1 micrometer, the PMGI layer 32 may become too thin to support the photoresist layer 34, causing the conventional undercut bilayer structure 30 to collapse. Thus, transfer of the pattern of the conventional undercut bilayer structure 30 to the conventional magnetic element 20' and liftoff of the conventional undercut bilayer structure 30 become difficult. For areal densities of 200 Gb/in$^2$ and track widths of 0.08 micrometer or less, the conventional method 10 and conventional undercut bilayer structure 30 may be incapable of fabricating the conventional magnetic element 20'.

Accordingly, what is needed is a system and method for providing a magnetic element having smaller critical dimensions.

SUMMARY

A method and system for providing a magnetic element are disclosed. The method and system comprise providing a magnetic element stack that includes a plurality of layers and depositing a stop layer on the magnetic element stack. The method and system also comprise providing a dielectric anti-reflective coating (DARC) layer on the stop layer, forming a single layer mask for defining the magnetic element on a portion of the DARC layer, and removing a remaining portion of the DARC layer not covered by the single layer mask. The portion of the DARC layer covers a portion of the stop layer. The method further includes removing a remaining portion of the stop layer and defining the magnetic element using at least the portion of stop layer as a mask.

DETAILED DESCRIPTION OF THE PREFERRED EMBODIMENTS

Figure 1:
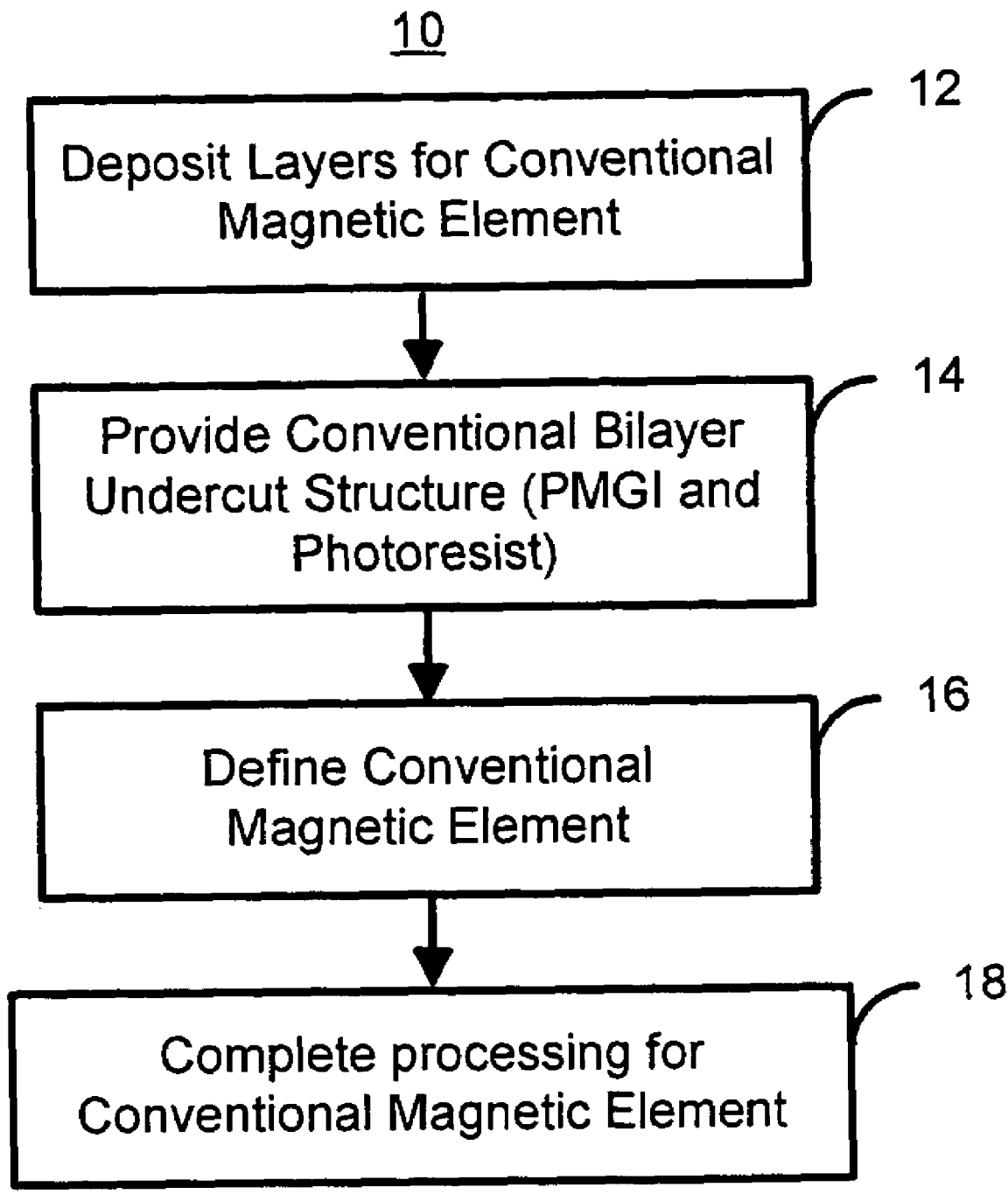
FIG. 1 is a flow chart depicting a conventional method for providing a conventional magnetic element.
Figure 2:
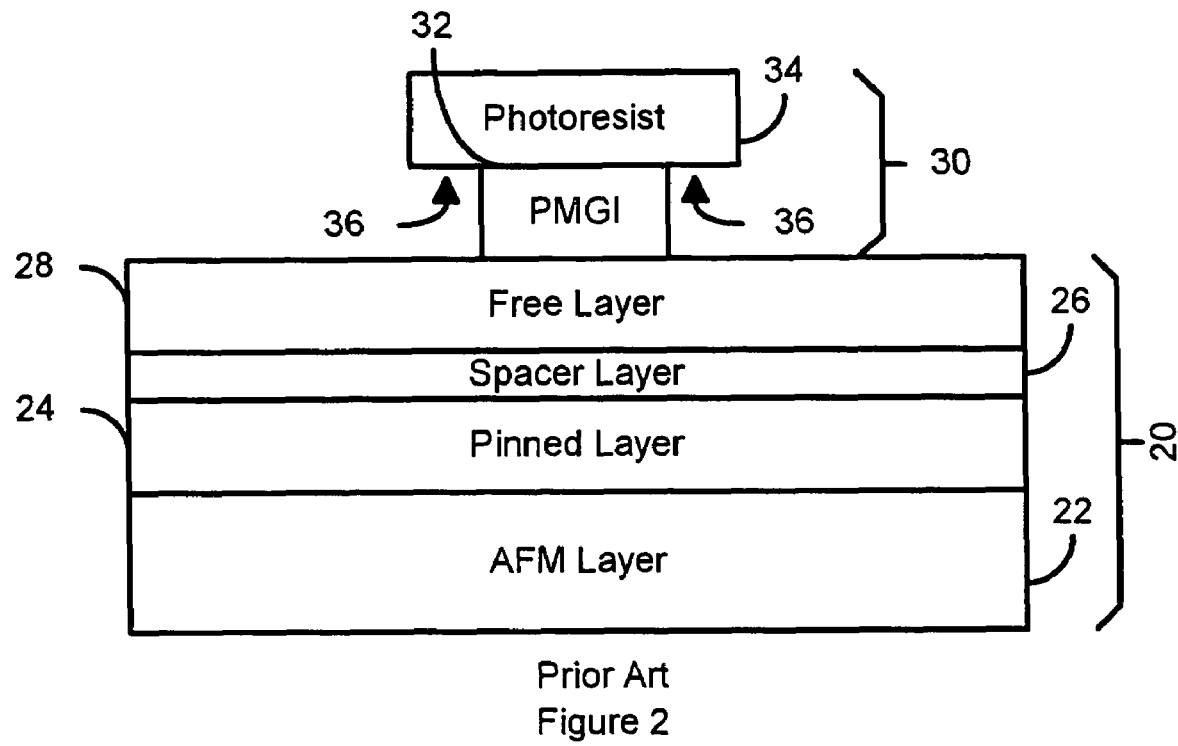
FIG. 2 depicts a conventional magnetic element during fabrication.
Figure 3:
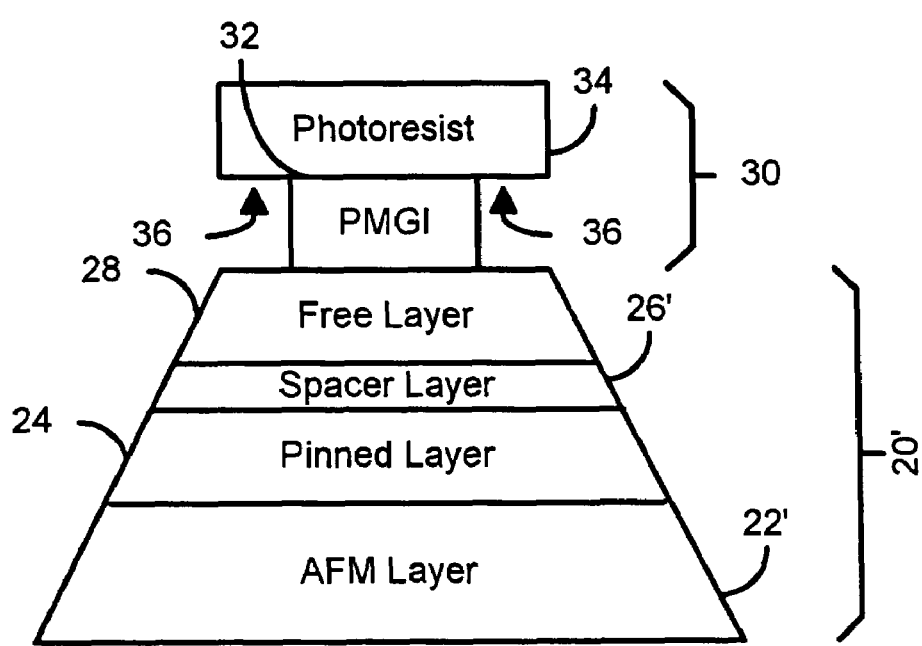
FIG. 3 depicts a conventional magnetic element during fabrication.
Figure 4:
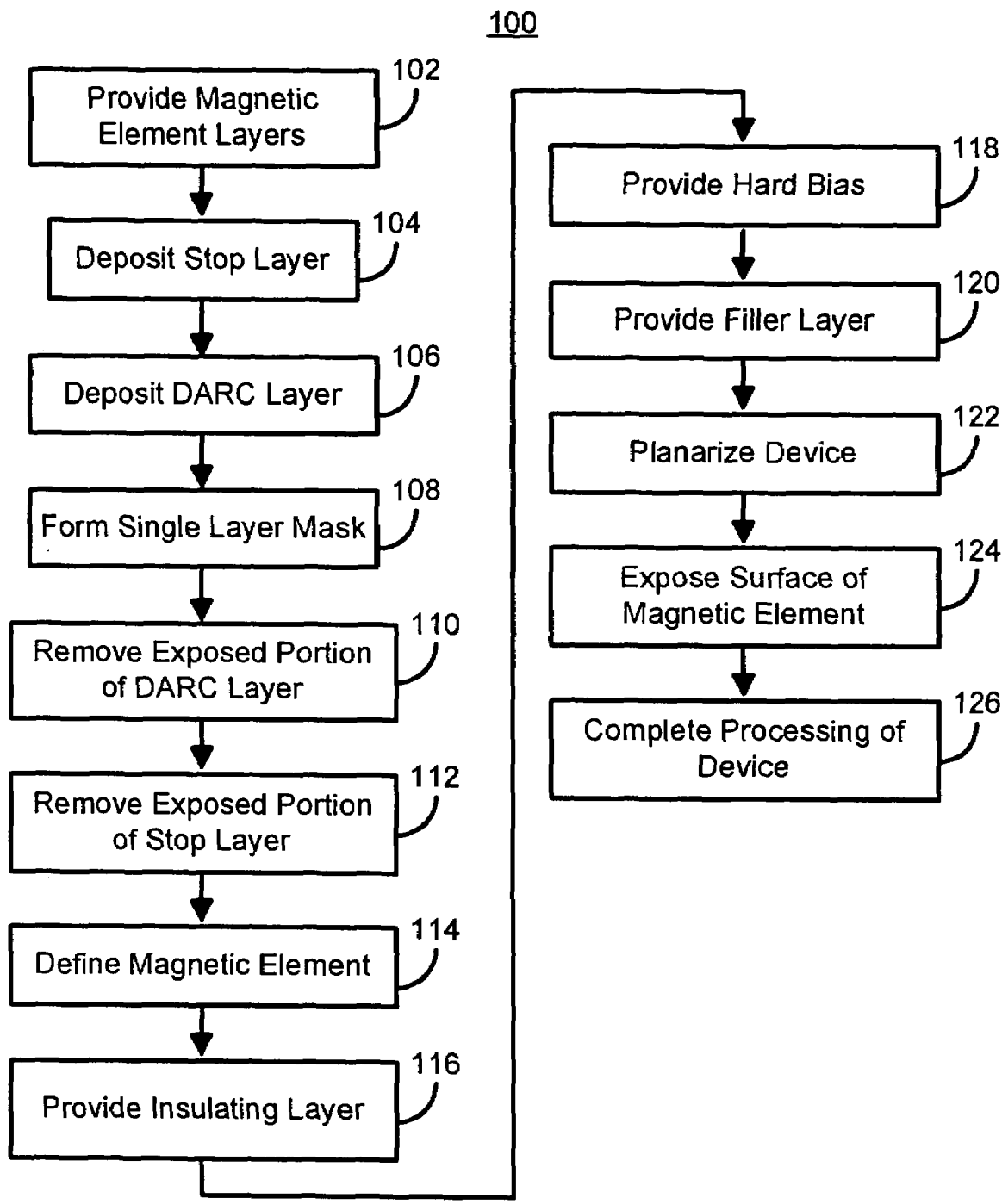
FIG. 4 is a flow chart depicting a method in accordance with an exemplary embodiment of the present invention for fabricating a magnetic element.

FIG. 4 is a flow chart depicting a method 100 in accordance with another exemplary embodiment of the present invention for fabricating a magnetic element. FIGS. 5-13 depict a magnetic element residing in a transducer 200 during fabrication in accordance with an exemplary embodiment of the present invention. The method 100 is described in the context of a particular magnetic element, a TMR stack. However, one of ordinary skill in the art will readily recognize that the method 100 can be used in conjunction with other magnetic elements such as spin valves. In addition, steps may be omitted or combined for ease of explanation. Further, fabrication of the magnetic element is described in the context of a transducer 200. However, in an alternate embodiment, the magnetic element may be used in a different device.

The layers for the magnetic element are deposited, via step 102. In a preferred embodiment, step 102 includes depositing a pinning layer such as an AFM layer, a pinned layer, a spacer layer, and a free layer. The pinned layer and free layer may be simple ferromagnetic layers or may by synthetic antiferromagnets including ferromagnetic layers separated by conductive nonmagnetic layer(s). The spacer layer is preferably an insulator and acts as a tunneling barrier. In addition, seed and/or capping layers may be provided in step 102. Although the magnetic element layers provided in step 102 are preferably for a TMR stack, in another embodiment, the layers could be for another magnetic element.

A stop layer is deposited on the magnetic element layers, via step 104. The stop layer is preferably used as a chemical mechanical polish (CMP) stop. In a preferred embodiment, the stop layer provided in step 104 is a diamond-like carbon (DLC) layer. However, in another embodiment, other material(s) may be used. A dielectric antireflective coating (DARC) layer is provided on the stop layer, via step 106. As its name suggests, the DARC layer is an antireflective layer configured to reduce reflections during photolithographic processes. In addition, the DARC layer preferably improves adhesion of a subsequent mask layer. Also in a preferred embodiment, the DARC layer is resistant to etches used to remove the subsequent mask layer.

A single layer mask is provided, via step 108. Step 108 includes depositing and developing the single layer mask where photoresist is used for the single layer mask. In a preferred embodiment, step 108 optionally also includes trimming the single layer mask to further reduce the critical dimension of the single layer mask.

Figure 5:
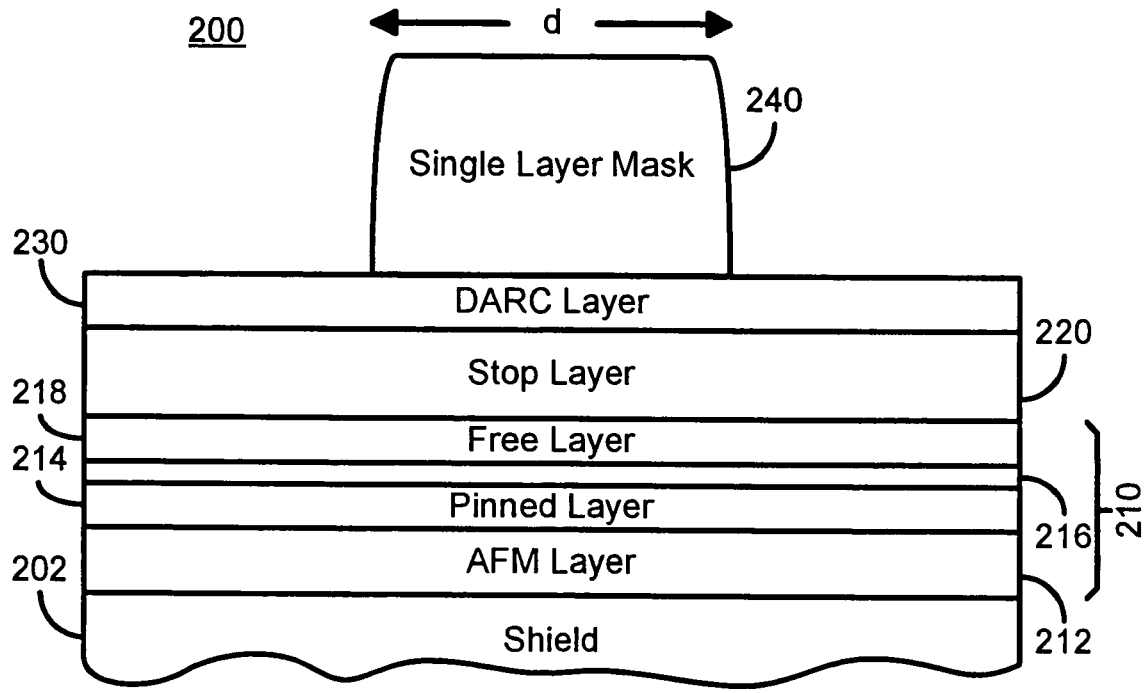
FIG. 5 is a diagram of a magnetic element during fabrication in accordance with an exemplary embodiment of the present invention.

FIG. 5 depicts the transducer 200 after at least a portion of step 108 has been performed. The transducer 200 is depicted before trimming, if any, in step 108 is performed. Shown in FIG. 5 are magnetic element layers 210, stop layer 220, DARC layer 230, and single layer mask 240. In the embodiment shown, the magnetic element layers 210 reside on a shield 202. In the embodiment shown, the magnetic element layers 210 include an AFM layer 212, a pinned layer 214, an insulator spacer layer 216, and a free layer 218. Note that although a particular orientation of the layers 212, 214, 216, and 218 with respect to the shield 202 is shown, another orientation could be used. For example, the orientation of the layers 212, 214, 216, and 218 could be reversed. The stop layer 220 depicted is preferably a DLC layer. However, in an alternate embodiment, the stop layer 220 could include other materials such as Ta, W, alumina, and/or silicon dioxide. The DARC layer 230 preferably includes at least one or more of $SiO_3$, $Si_xN_4$ and $SiO_xN_y$. However, in another embodiment, the DARC layer 230 may include other materials or combinations of materials such as $SiO_3$, $Si_xN_4$ and $SiO_xN_y$. In a preferred embodiment, the DARC layer 230 improves adhesion of the single layer mask 240. The single layer mask 240 is preferably a deep ultraviolet (DUV) photoresist mask. The DARC layer 230 is, therefore, preferably configured to reduce reflections of the DUV light used in developing the single layer mask 240. In one embodiment, the single layer mask 240 is developed to have a critical dimension, d, of approximately 0.1 µm, at the lower limit of photolithography using DUV photoresist. In another embodiment, the single layer mask 240 may have a different critical dimension.

Figure 6:
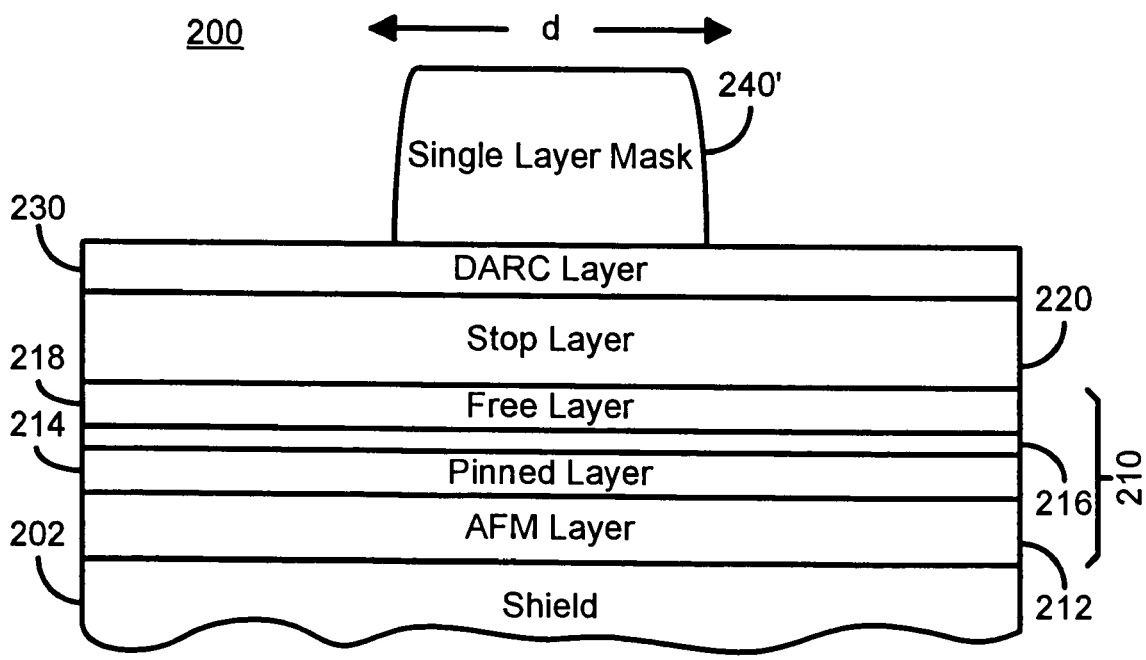
FIG. 6 is another diagram of the magnetic element during fabrication in accordance with an exemplary embodiment of the present invention.

FIG. 6 depicts the transducer 200 after step 108 has been completed. Thus, the transducer 200 is depicted after the trimming has been performed in a preferred embodiment of step 108. If DUV photoresist is used for the single layer mask 240, the trimming of the single layer mask may be performed using an oxygen plasma reactive ion etch (RIE). As a result, the single layer mask 240' is still present, but has a smaller critical dimension. In one embodiment, the critical dimension of the single layer mask 240' is approximate 0.08 µm. In a preferred embodiment, the underlying DARC layer 230 is also resistant to the oxygen plasma used in the RIE. Consequently, trimming of the single layer mask 240' in step 108 does not significantly affect the DARC layer 230.

A portion of the DARC layer 230 that does not reside under the single layer mask 240' is removed, via step 110. Thus, the pattern of the single layer mask 240' is transferred to the DARC layer 230. In a preferred embodiment, step 110 is performed using a fluorine plasma (e.g. $CF_4$) RIE. Also in a preferred embodiment, the stop layer 220 is resistant to the etch used to remove the DARC layer 230, such as the fluorine plasma RIE. As a result, step 110 may overetch the DARC layer 230 without adversely affecting the underlying magnetic element layers 210. Such an overetch ensures complete removal of the exposed portions of the DARC layer 230.

Figure 7:
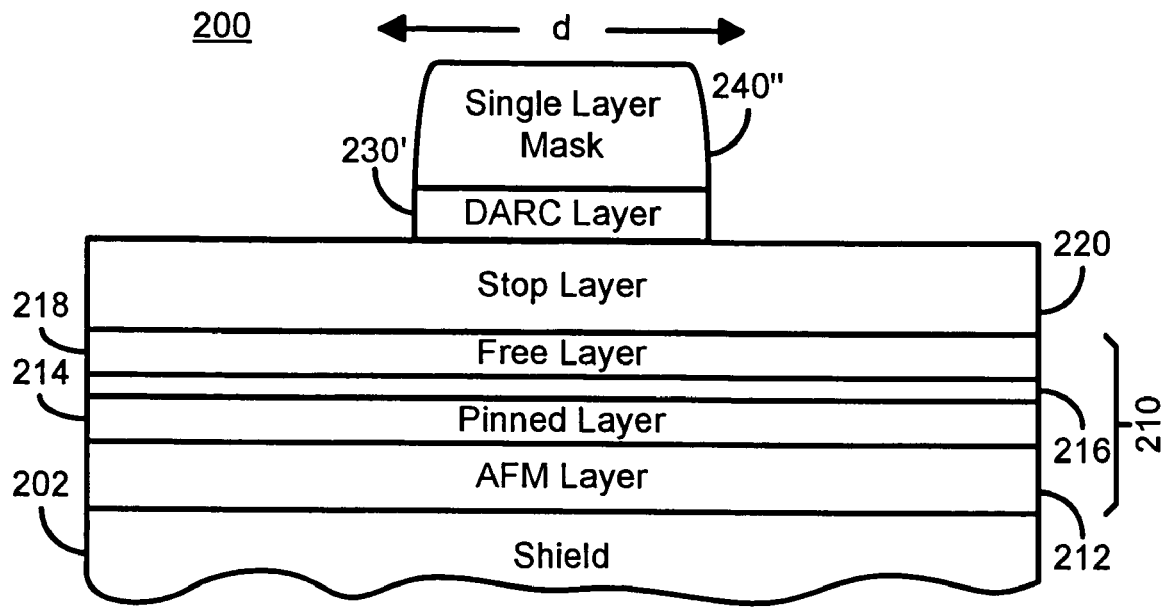
FIG. 7 is another diagram of the magnetic element during fabrication in accordance with an exemplary embodiment of the present invention.

FIG. 7 depicts the transducer 200 after step 110 has been performed. As can be seen in FIG. 7, the pattern of the single layer mask 240" has been transferred to the DARC layer 230'. Because an overetch may be performed, the exposed portion of the DARC layer has been completely removed. Thus, only the portion 230' of the DARC layer under the single layer mask 240" remains. In addition, some portion of the single layer mask 240" may remain after the etch of the DARC layer.

The exposed portion of the stop layer is removed, via step 112. Stated differently, the pattern of the single layer mask 240' is transferred to the stop layer 220. If the stop layer 220 is a DLC layer, then step 112 is preferably performed using an oxygen plasma RIE. However, for other materials, a different etch process might be used. For example, a carbon monoxide or fluorine etch might be used if the stop layer 220 includes materials such as Ta, W, alumina or silicon dioxide.

Figure 8:
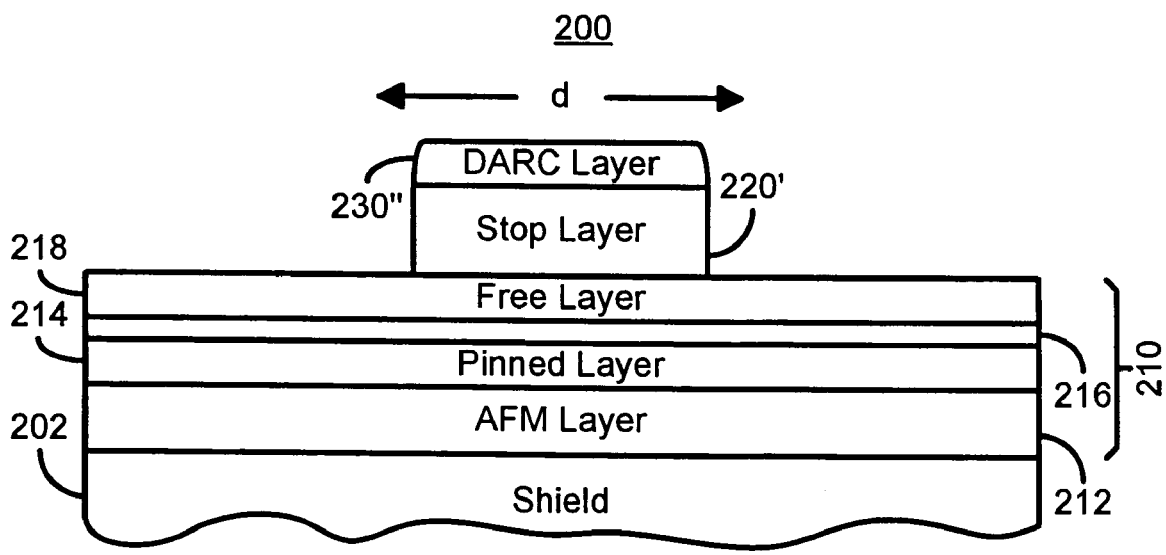
FIG. 8 is another diagram of the magnetic element during fabrication in accordance with an exemplary embodiment of the present invention.

FIG. 8 depicts the transducer 200 after step 112 has been performed. Because of the etch performed in step 112, only a portion of the stop layer 220' remains. In addition, the single layer mask 240' may be removed during step 112, for example using an oxygen plasma RIE or solvent. However, a portion of the DARC layer 230" remains, acting as a mask for the underlying stop layer 220'. This is because the DARC layer 230" is preferably resistant to the etch performed in step 112.

The magnetic element is defined, via step 114. The pattern is thus transferred to the underlying magnetic element layers 210. In a preferred embodiment, step 114 is performed by ion milling the magnetic element layers, generally using Ar ions. The stop layer 220' is preferably insensitive to the process that defines the magnetic element and, therefore, functions as a mask during step 114.

Figure 9:
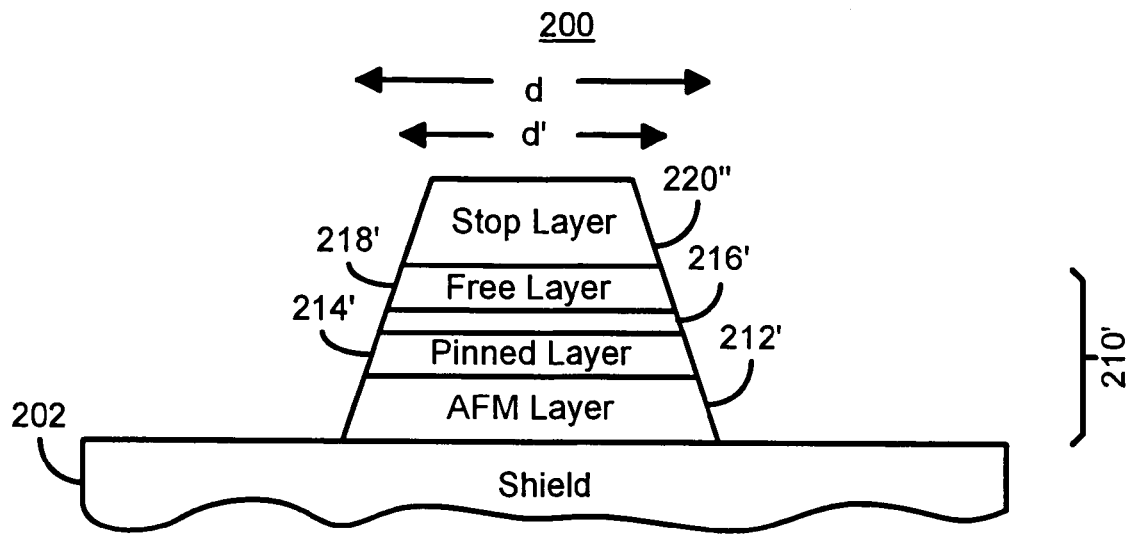
FIG. 9 is another diagram of the magnetic element during fabrication in accordance with an exemplary embodiment of the present invention.

FIG. 9 depicts the transducer 200 after the magnetic element 210' has been defined in step 114. In the embodiment shown, the DARC layer is removed during step 114 and is thus not depicted. The magnetic element 210' having the desired profile and desired critical dimension, d', may thereby be formed. For example, in one embodiment, the magnetic element 210' may have a critical dimension of less than or equal to 0.08 μm, as typically measured at the free layer 218'.

Figure 10:
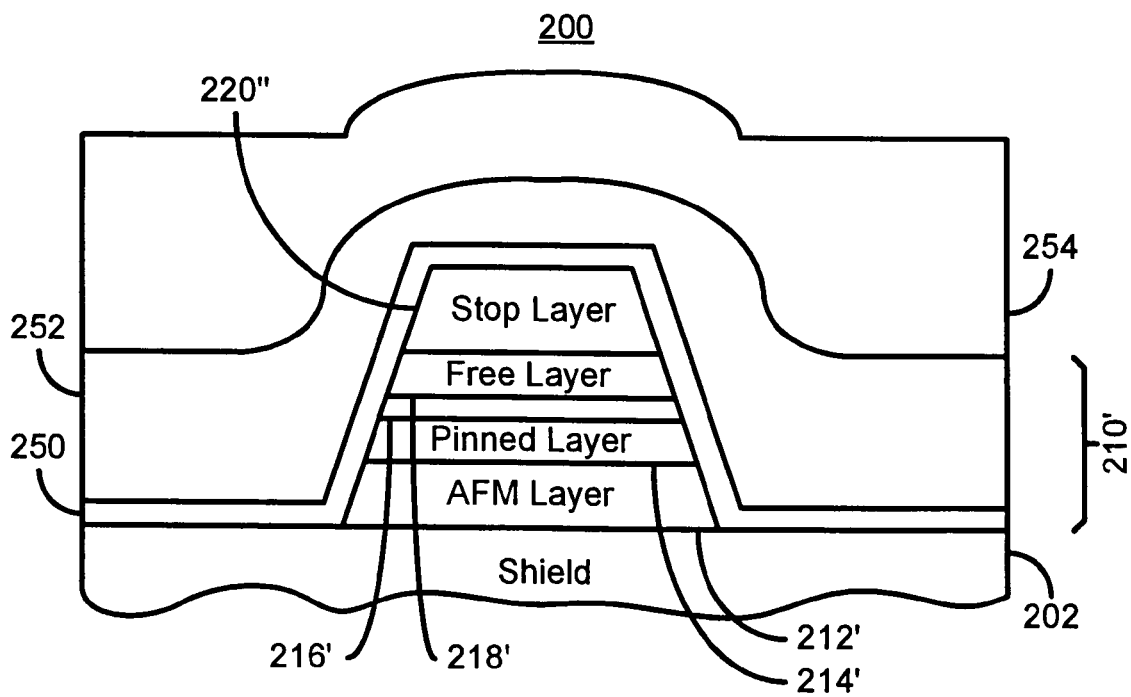
FIG. 10 is another diagram of the magnetic element during fabrication in accordance with an exemplary embodiment of the present invention.

Processing then continues. If a read head is being formed, then an insulator is deposited on the magnetic element 210', via step 116. The insulator is preferably alumina, but may include other materials, such as $SiO_2$. A hard bias layer is provided, via step 118. Step 118 include providing a hard magnet used in biasing the magnetic element 210'. In addition, a filler is provided, via step 120. The filler is preferably Cr. However, in another embodiment, the filler provided in step 120 could include other materials such as alumina, silicon dioxide, or silicon nitride. FIG. 10 depicts the transducer 200 after step 120 has been completed. Thus, the magnetic element 210' and remaining stop layer 220" have been covered in an insulator 250, a hard bias layer 252, and a filler 254 that is preferably Cr. The filler 254 is used to protect the underlying hard bias layer 252 from subsequent processing.

The device is planarized, via step 122. In a preferred embodiment, the planarization is performed using a CMP step. Also in a preferred embodiment, the CMP is continued until the stop layer 220" is exposed.

Figure 11:
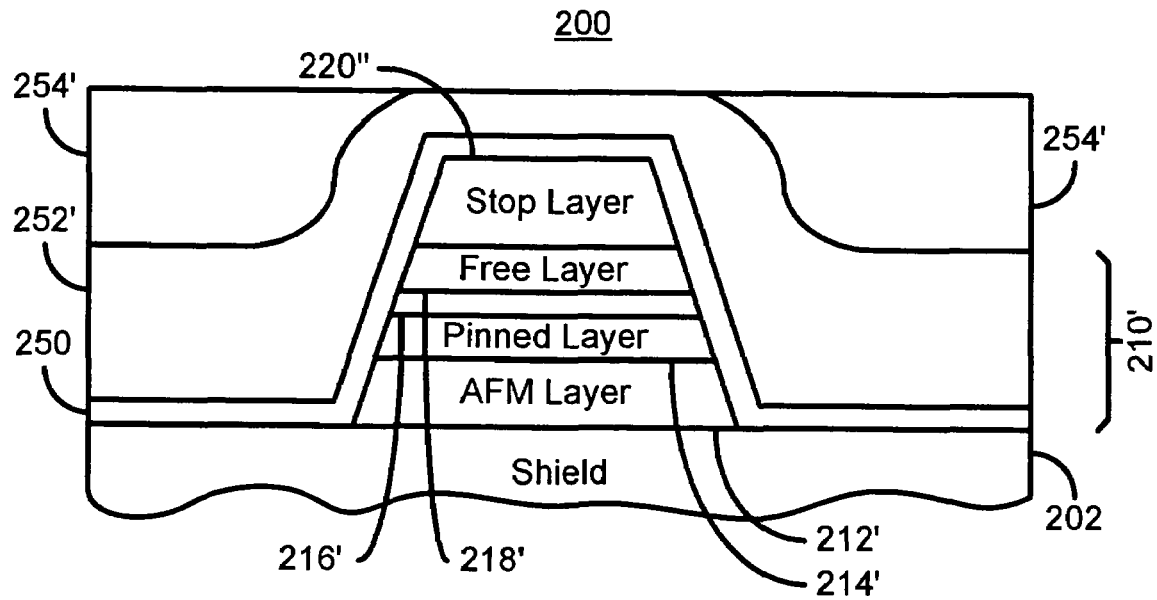
FIG. 11 is another diagram of the magnetic element during fabrication in accordance with an exemplary embodiment of the present invention.
Figure 12:
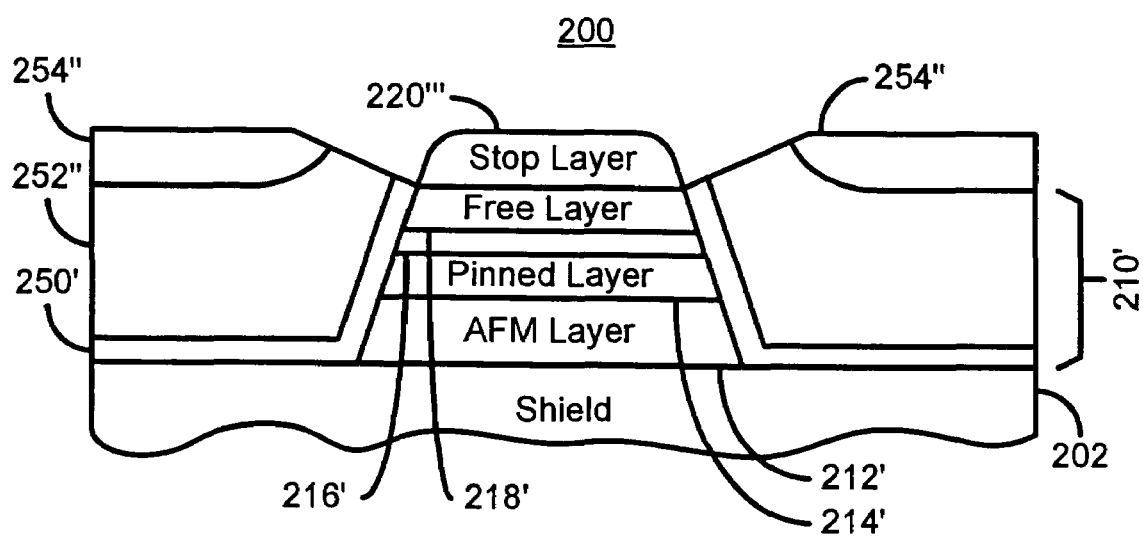
FIG. 12 is another diagram of the magnetic element during fabrication in accordance with an exemplary embodiment of the present invention.

FIG. 11 depicts the transducer 200 after a portion of step 122 has been performed. Consequently, part of the filler layer has been removed, leaving portions 254'. A portion of the hard bias layer has also been removed, leaving remaining portion 252'. The exposed surface is, therefore, planar. However, as discussed above, the planarization may be continued to overpolish the device 200. FIG. 12 depicts the transducer 200 after completion of step 122. Thus, portions of the filler 254" and hard bias 252" remain. In addition, the insulator 250' is exposed. However, the stop layer 220'" remains substantially intact. Consequently, the stop layer 220'" may still mask the underlying magnetic element 210', protecting the magnetic element 210' from damage.

Figure 13:
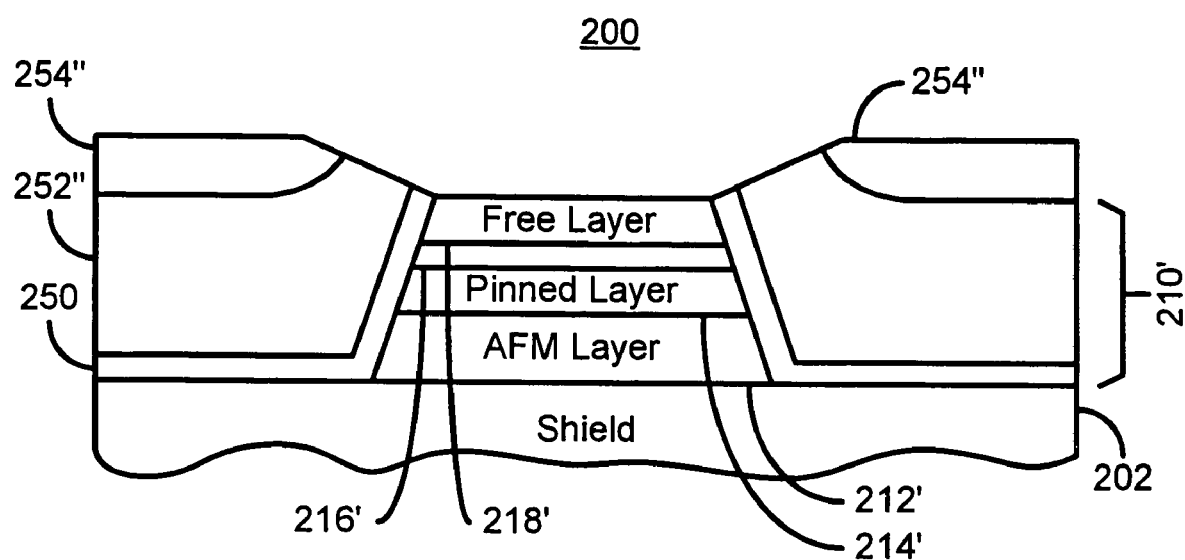
FIG. 13 is another diagram of the magnetic element during fabrication in accordance with an exemplary embodiment of the present invention.

The surface of the magnetic element 210' is exposed, via step 124. Step 124 may be carried out using the same etch as step 112. If the remaining portion of the stop layer 220'" is a DLC layer, step 124 is preferably performed using an oxygen plasma RIE. However, for other materials, a different etch might be used. For example, a carbon monoxide or fluorine etch might be used if the remaining portion of the stop layer 220'" includes materials such as Ta, W, alumina or silicon dioxide. FIG. 13 depicts the transducer 200 after step 124 has been performed. The top surface of the magnetic element 210' is thus exposed.

Processing of the device may be completed, via step 126. For the transducer 200, step 126 may include providing contacts on the top surface of the exposed magnetic element 210'. Additional insulating and shield layers may also be provided. If the transducer 200 is part of a merged head, then step 126 may include providing other structures, such as a write transducer. If the magnetic element 210' and method 100 are used for another device, then other layers and/or additional layers having different structures and functions may be provided in step 126.

Thus, the method 100 can provide the magnetic element 210'. Because a single layer mask 230' is utilized, issues due to problems with lift-off and collapse of a bilayer photoresist structure can be avoided. Further, the single layer mask 230', and thus the magnetic element 210', can be made smaller than the critical dimensions of photolithography. As a result, the magnetic element can be made smaller than is possible using conventional photolithography. In one embodiment, the magnetic element 210' can have a critical dimension of 0.08 μm or less. As a result, the method 100 and magnetic element 210' may be suitable for higher density recording applications.

We claim:

1. A method for providing a magnetic element comprising;
   providing a magnetic element stack including a plurality of layers;
   depositing a stop layer on the magnetic element stack;
   providing a dielectric antireflective coating (DARC) layer on the stop layer;
   forming a single layer mask having a first width for defining the magnetic element on a first portion of the DARC layer;
   removing a second portion of the DARC layer not covered by the single layer mask, the first portion of the DARC layer covering a first portion of the stop layer;
   continuing removal of the DARC layer until the first portion has a second width not larger than the first width;
   removing a second portion of the stop layer not covered by the first portion of the DARC layer to form a third portion of the stop layer, the third portion having a third width greater than or equal to the second width; and
   defining the magnetic element using at least the third portion of stop layer as a mask.

2. The method of claim 1 wherein the stop layer depositing further includes:
   depositing diamond-like carbon layer on the magnetic element stack.

3. The method of claim 2 wherein the remaining portion of the stop layer removing further includes:
   performing an oxygen plasma reactive ion etch.

4. The method of claim 1 wherein the stop layer depositing further includes:
   depositing a layer include at least one of Ta, W, Alumina, and silicon dioxide on the magnetic element stack.

5. The method of claim 4 wherein the remaining portion of the stop layer removing further includes:
   performing an oxygen plasma reactive ion etch, a carbon monoxide etch, or a fluorine etch.

6. The method of claim 1 wherein the DARC layer providing step further includes:
   providing a layer including at least one of $SiO_3$, $Si_xN_4$ and $SiO_xN_y$.

7. The method of claim 1 wherein the remaining portion of the DARC layer not covered by the single layer mask removing further includes:
   performing a fluorine plasma reactive ion etch.

8. The method of claim 1 wherein the single layer mask forming further includes:
   forming the single layer mask using deep ultra violet photoresist.

9. The method of claim 8 wherein the single layer mask forming further includes:
   trimming the single layer mask.

10. The method of claim 1 wherein the magnetic element defining further includes:
    performing an ion milling or reactive ion etching.

11. The method of claim 1 further comprising:
    depositing an insulating layer;
    fabricating a hard bias layer on the insulating layer; and
    creating a Cr filler layer on the hard bias layer.

12. The method of claim 11 further comprising:
    performing a planarization, the portion of the stop layer acting as a planarization stop.

13. The method of claim 12 further comprising:
    exposing a top portion of the magnetic element.

14. The method of claim 13 wherein the exposing further includes:
    removing at least part of the portion of the stop layer.

15. The method of claim 1 further comprising:
    depositing an insulating layer;
    fabricating a hard bias layer on the insulating layer; and
    creating a filler layer including at least one of alumina, silicon dioxide, and silicon nitride on the hard bias layer.

16. A method for forming a magnetic element comprising:
    providing a magnetic element stack including a plurality of layers;
    depositing a diamond-like carbon layer on the magnetic element stack;
    providing a dielectric antireflective coating (DARC) layer on the diamond-like carbon layer;
    forming a single layer mask having a first width for defining the magnetic element on a portion of the DARC layer, the single layer mask including a deep ultra-violet photoresist;
    removing a second portion of the DARC layer not covered by the single layer mask using a fluorine plasma reactive ion etch, the first portion of the DARC layer covering a first portion of the diamond-like carbon layer;
    continuing removal of the DARC layer until a second width of the first portion of the DARC layer is not larger than the first width;
    removing a second portion of the diamond-like carbon layer using an oxygen reactive ion etch to form a third portion of the diamond-like carbon layer, the third portion of the diamond-like carbon layer having a third width greater than or equal to the second width;
    defining the magnetic element using at least the portion of diamond-like carbon layer as a mask using an ion milling step;
    depositing a plurality of layers on the magnetic element including a Cr filler layer.

* * * * *